(12) United States Patent
Heo et al.

(10) Patent No.: US 6,613,693 B1
(45) Date of Patent: Sep. 2, 2003

(54) ETCHANT USED IN THE MANUFACTURE OF SEMICONDUCTOR DEVICES AND ETCHING METHOD USING THE SAME

(75) Inventors: Yong-woo Heo, Yongin (KR); Heoung-bin Lim, Sungnam (KR); Jun-ing Gil, Hwasung-gun (KR); Eun-mi Bae, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 26 days.

(21) Appl. No.: 09/696,741

(22) Filed: Oct. 26, 2000

(30) Foreign Application Priority Data

Oct. 27, 1999  (KR) .......................................... 99-46910

(51) Int. Cl.[7] .......................................... H01L 21/302
(52) U.S. Cl. ...................................... 438/745; 747/757
(58) Field of Search ................................. 438/745, 747, 438/757; 216/93, 94; 156/345

(56) References Cited

U.S. PATENT DOCUMENTS 3,867,218 A * 2/1975 Henry ............................ 156/8
5,310,457 A * 5/1994 Ziger ............................ 156/657
5,470,421 A * 11/1995 Nakada et al. ............ 156/642.1
5,472,562 A * 12/1995 Ziger ......................... 156/657.1
6,001,215 A * 12/1999 Ban ............................. 156/345

FOREIGN PATENT DOCUMENTS

JP          9-275091         10/1997

* cited by examiner

Primary Examiner—Robert Kunemund
Assistant Examiner—Duy-Vu Deo
(74) Attorney, Agent, or Firm—Volentine Francos, PLLC

(57) ABSTRACT

A nitride film etchant used in the manufacture semiconductor devices, and an etching method using the etchant, are provided. A wafer having a nitride film formed thereon is introduced into a bathing tube containing an etchant which is a water solution containing phosphoric acid ($H_3PO_4$) of a concentration of 50–70% by weight and hydrofluoric acid (HF), and the nitride film is etched by the etchant. When the concentration of HF is 0.005 to 0.05% by weight, the etch rate of the nitride film is increased, and the selectivity between the nitride film and an oxide film is kept very high. Also, an etchant containing HF of a concentration of 0.05% by weight is provided as a water solution mixed with $H_3PO_4$ and HF. Addition of HF of 0.05% by weight or less increases the etch rate of the nitride film, and a high selectivity of the nitride film with respect to an oxide film is maintained.

4 Claims, 3 Drawing Sheets

\* ETCH CONDITIONS : 120°C, NO ADDITIVES EXCEPT FOR $H_3PO_4$

* ETCH CONDITIONS : 120°C, NO ADDITIVES EXCEPT FOR $H_3PO_4$

* ETCH CONDITIONS : 100°C, HF OF 0.02% BY WEIGHT

* ETCH CONDITIONS : 120°C, PHOSPHORIC ACID OF 60% BY WEIGHT

* ETCH CONDITIONS : 100°C, PHOSPHORIC ACID OF 55% BY WEIGHT

ETCHANT USED IN THE MANUFACTURE OF SEMICONDUCTOR DEVICES AND ETCHING METHOD USING THE SAME

BACKGROUND OF THE INVENTION

1. Field of the Invention

The present invention relates to an etchant used in the manufacture of semiconductor devices and to an etching method which uses the etchant. More particularly, the present invention relates to a nitride film etchant that can be used at low temperatures in the manufacture of semiconductor devices, and to an etching method which uses the nitride film etchant.

2. Description of the Related Art

Nitride films, in particular, silicon nitride films, are physically and chemically stable, and are thus often used in the manufacture of semiconductor devices. For example, such films are increasingly used as insulating films and capacitor dielectric films, as well as etch stop films during the etching of silicon oxide films. Typically, silicon nitride films have a higher dielectric constant and a higher mechanical hardness than silicon oxide films, and excel in preventing vapor and sodium from being diffused into under layers of the silicon nitride films. Also, silicon nitride films are not prone to the generation of pin hole defects. For these and other reasons, the use of silicon nitride films is increasing.

However, the physical and chemical stability of silicon nitride films also makes them relatively difficult to etch. Also, silicon nitride films must often be etched while maintaining a high etch selectivity with respect to a silicon oxide film or a polysilicon film. For example, as mentioned above, silicon nitride films are frequently used as an etch mask in an etch process for patterning silicon oxide films. In such cases, after the silicon oxide film is etched, the silicon nitride film which was used as an etch mask is typically etched by a wet etching method.

In an existing wet etching process, a wafer having a silicon nitride film thereon is introduced into an etching bath containing phosphoric acid ($H_3PO_4$) of 85% by weight to selectively etch the silicon nitride film while maintaining a high etch selectivity of about 20% or greater with respect to a silicon oxide film. The etching bath is heated to a high temperature of about 160–170° C. In this wet etching process, the etch rates of a silicon nitride film and a silicon oxide film are about 40 to 45 Å/min and 1.2 to 2.0 Å/min, respectively, and the etch selectivity between the silicon nitride film and the silicon oxide film is about 26.56.

When etching a silicon nitride film through wet etching, the aforementioned high temperature is applied in order to increase the etch rate of the silicon nitride film. This is in consideration of the fact that the etch rate of a typical silicon nitride film is proportional to the applied temperature.

However, when a high temperature condition is applied as in the existing wet etching process, it is difficult to maintain the concentration of the $H_3PO_4$ solution at a desired value. That is, at a high temperature, the concentration of an etchant increases since the moisture contained in the etchant readily evaporates, thus causing a difference between the desired concentration of the etchant and the actual concentration of the etchant contained in an etching bath. Thus, when a silicon nitride film is etched at 160–170° C., deionized (DI) water must be continuously supplied to maintain the concentration of phosphoric acid in the etchant at a level which produces the required process condition. Furthermore, in this case, chemical matter (phosphoric acid) is partially evaporated as well, although at lesser quantities than the moisture. Thus, the chemical itself must also be continuously supplied.

High concentrations of $H_3PO_4$ etchant caused by the evaporation of moisture can damage etching equipment, thus serving as a factor which shortens the life span of the etching equipment. Improper concentrations of $H_3PO_4$ etchant can also adversely effect etching time and effectiveness. However, the continuous supply of different quantities of DI water and chemical to avoid such improper concentrations of $H_3PO_4$ etchant is difficult to accurately control.

Therefore, an etchant having a new composition is desired which is capable of etching a nitride film at a low temperature while maintaining a high etch selectivity between the nitride film and an oxide film.

SUMMARY OF THE INVENTION

An object of the present invention is to provide an etchant used in the manufacture of semiconductor devices, the etchant capable of etching a nitride film at a high etch rate and a low temperature while maintaining a high etch selectivity between the nitride film and an oxide film.

Another object of the present invention is to provide a method of etching a nitride film using the above-described etchant.

To achieve the first object, the present invention provides an etchant for a nitride film used in the manufacture of semiconductor devices, wherein the etchant is a water solution containing phosphoric acid ($H_3PO_4$) of a concentration of 50–70% by weight and hydrofluoric acid (HF).

Preferably, the concentration of HF in the etchant is 0.005–0.05% by weight.

To achieve the second object, the present invention provides a method of etching a nitride film, wherein a wafer having a nitride film formed thereon is introduced into a bathing tube containing an etchant which is a water solution containing phosphoric acid ($H_3PO_4$) of a concentration of 50–70% by weight and hydrofluoric acid (HF), and wherein the nitride film is etched by the etchant.

It is preferable that the temperature of the etchant is 130° C. or less. More preferably, the temperature of the etchant is 100 to 120° C.

Preferably, the concentration of HF in the etchant is 0.005–0.05% by weight.

According to the present invention, the etch rate of a nitride film can be increased compared to the prior art by setting the concentration of phosphoric acid to be, preferably, 50–70% by weight when etching the nitride film using an etchant including phosphoric acid and hydrofluoric acid. Preferably, the composition of the hydrofluoric acid is set to be 0.005–0.05% by weight. Accordingly, the etchant according to the present invention can etch a nitride film faster than the prior art even at a temperature of 130° C. or less, which is lower than the temperature in the prior art. Also, the etchant according to the present invention can maintain a higher etch selectivity between an oxide film and the nitride film than that in the prior art.

To achieve the first object, the present invention also provides an etchant for a nitride film used in the manufacture of semiconductor devices, wherein the etchant is a water solution containing hydrofluoric acid (HF) of a concentration of 0.05% by weight or less and phosphoric acid ($H_3PO_4$).

Preferably, the concentration of HF in the etchant is 0.005–0.05% by weight.

It is preferable that the concentration of $H_3PO_4$ in the etchant is 50–70% by weight.

To achieve the second object, the present invention also provides a method of etching a nitride film used to manufacture semiconductor devices, wherein a wafer having a nitride film formed thereon is introduced into a bathing tube containing an etchant which is a water solution containing hydrofluoric acid (HF) of a concentration of 0.05% by weight or less and phosphoric acid ($H_3PO_4$), and the nitride film is etched by the etchant.

It is preferable that the temperature of the etchant is 130° C. or less. More preferably, the temperature of the etchant is 100 to 120° C.

Preferably, the concentration of HF in the etchant is 0.005–0.05% by weight, and the concentration of $H_3PO_4$ in the etchant is 50–70% by weight.

According to the present invention, an etchant including phosphoric acid and hydrofluoric acid can etch a nitride film faster than the prior art at a temperature of 130° C. or less (more preferably, 100–120° C.) which defines a temperature range that is lower than the prior art, by setting the concentration of hydrofluoric acid to be 0.05% or less. Also, addition of hydrofluoric acid at the above-mentioned concentration increases the etch rate of a nitride film and increases the etch selectivity between an oxide film and the nitride film. Furthermore, when the concentration of phosphoric acid is set to be 50–70% by weight, the etch rate of the nitride film further increases.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Hereinafter, preferred embodiments of the present invention will be described in detail with reference to the attached drawings. However, the embodiments of the present invention can be modified into various other forms, and the scope of the present invention must not be interpreted as being restricted to the embodiments.

An etchant according to a preferred embodiment of the present invention contains phosphoric acid and hydrofluoric acid. Preferably, the concentration of the phosphoric acid is 50–70% by weight, and the concentration of the hydrofluoric acid is 0.005–0.05% by weight.

A nitride film etching method according to a preferred embodiment of the present invention is performed by dipping a wafer having a nitride film formed thereon in an etching bath containing an etchant having the above-described composition. Here, the nitride film is etched for a predetermined period of time at a temperature of 130° C. or less, preferably, 100–120° C.

Preferably, the etching bath is a closed system where an etching bath is closed to accurately control the concentration of each chemical within the etchant and the temperature of the etchant.

Non-restrictive embodiments of the present invention will now be described with reference to the attached drawings.

(1) Variation in the Etch Rate of a Silicon Nitride Film with Respect to Variations in the Concentration of Phosphoric Acid ($H_3PO_4$)

[Experiment 1]

Figure 1:
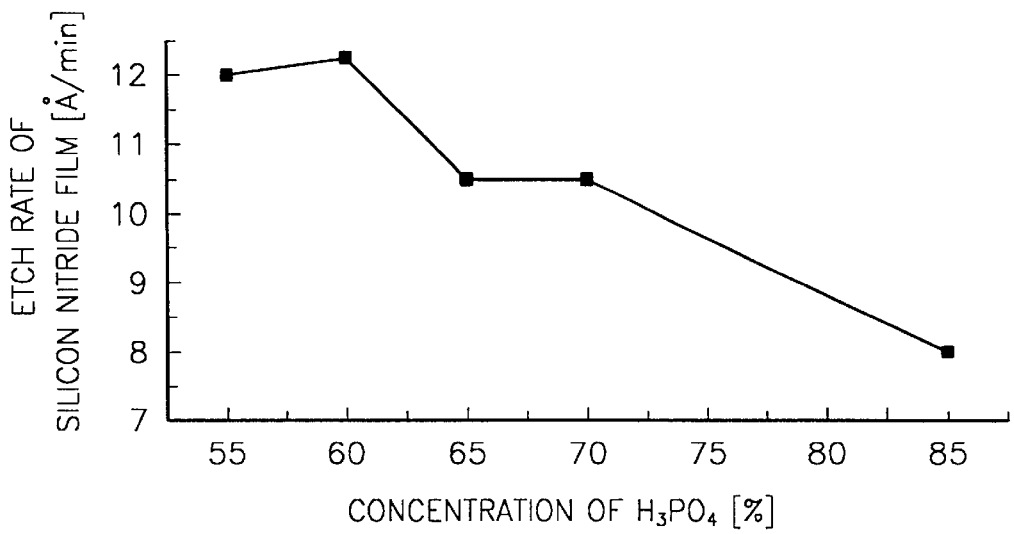
FIG. 1 is a graph showing the etch rate per minute of a silicon nitride film when the temperature of an etch solution without any additives except for phosphoric acid is 120° C.

A phosphoric acid solution was prepared as an etchant, and a silicon nitride film was etched using the phosphoric acid solution. Here, an etching bath containing an etchant was a closed system, and the temperature of the etching bath was kept at 120° C. The results of Experiment 1, in which the etch rate per minute of a silicon nitride film was measured with respect to the concentration of phosphoric acid, are shown in FIG. 1.

[Experiment 2]

Figure 2:
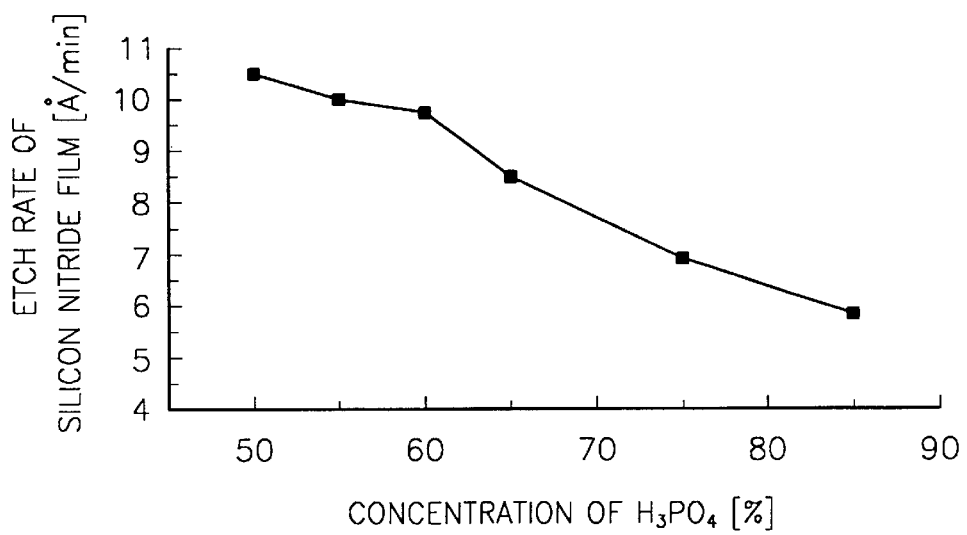
FIG. 2 is a graph showing the etch rate per minute of a silicon nitride film when the temperature of an etch solution containing phosphoric acid of 50–70% by weight and hydrofluoric acid of 0.02% by weight is 100° C.

A solution including phosphoric acid and hydrofluoric acid was prepared as an etchant, and a silicon nitride film was etched using this solution. Here, an etching bath containing the etchant was a closed system, and the temperature of the etching bath was kept at 100° C. In Experiment 2, the etch rate per minute of a silicon nitride film was measured with respect to variations in the concentration of phosphoric acid in a state where a predetermined amount of hydrofluoric acid (for example, 0.02% by weight) was added. The results of Experiment 2 are shown in FIG. 2.

The temperatures in Experiments 1 and 2 were 120° C. and 100° C., respectively, so that water in the phosphoric acid solutions was evaporated. Accordingly, when the concentration of phosphoric acid was low, the etch rate per minute of a silicon nitride film was unstable. Thus, FIGS. 1 and 2 do not show the etch rate per minute of a silicon nitride film measured when the concentration of phosphoric acid is low.

[Experiment 3]

A phosphoric acid solution was prepared as an etchant, and a silicon nitride film was etched using the phosphoric acid solution. Here, an etching bath containing an etchant was a closed system, and the temperature of the etching bath was kept at 98° C. In Experiment 3, the etch rate per minute of a silicon nitride film was measured with respect to the concentration of phosphoric acid, as in Experiment 1, and the results are shown in FIG. 3.

[Experiment 4]

Figure 4:
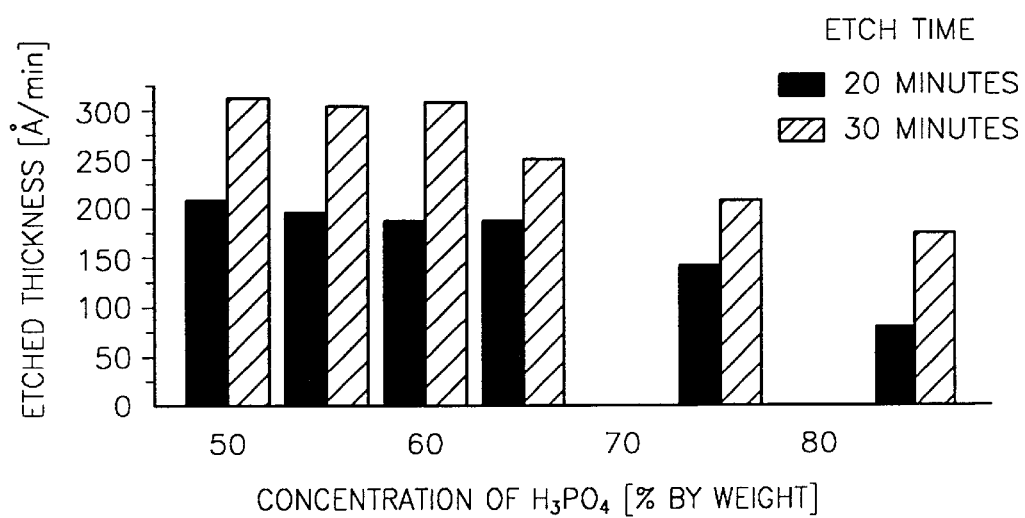
FIG. 4 is a graph showing the etched thickness of a silicon nitride film with respect to variations in the concentration of phosphoric acid when the temperature of an etchant containing hydrofluoric acid of 0.02% by weight is 100° C.

In Experiment 4, the etched thickness of a silicon nitride film was measured with respect to the concentration of phosphoric acid under substantially the same conditions as those in Experiment 2. The etched thickness of a silicon nitride film was measured 20 minutes and 30 minutes after etching started, and the results are shown as a bar graph in FIG. 4. In FIG. 4, the shaded bar denotes the etched thickness of a silicon nitride film measured 20 minutes after etching started, and the hatched bar denotes the etched thickness of a silicon nitride film measured 30 minutes after etching started.

Figure 3:
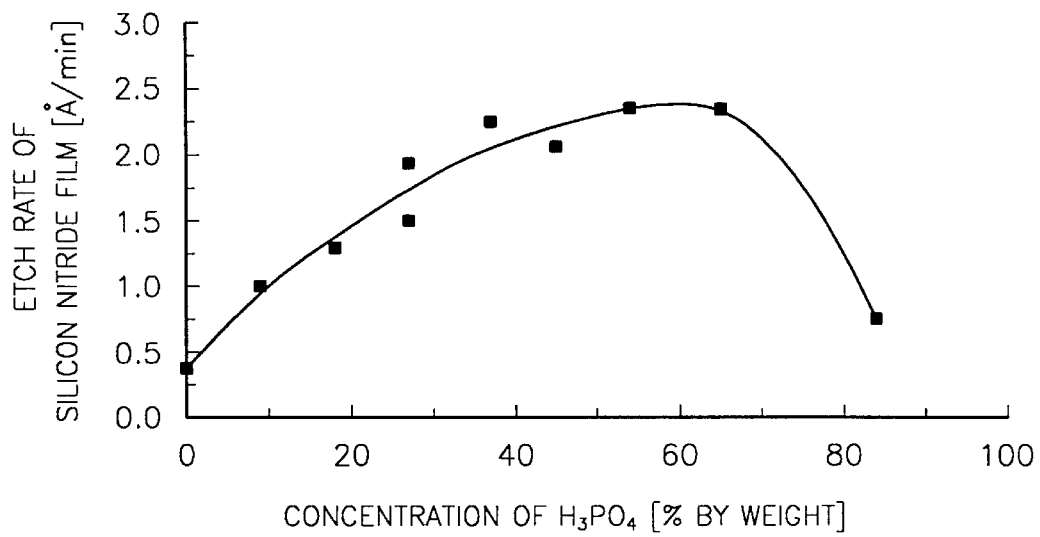
FIG. 3 is a graph showing the etch rate per minute of a silicon nitride film when the temperature of an etch solution without any additives except for phosphoric acid is 98° C.

Referring to FIGS. 1 through 3, it can be seen that, when a silicon nitride film is etched using an etchant containing phosphoric acid, the etch rate of the silicon nitride film is not necessarily proportional to the concentration of phosphoric acid.

More specifically, it can be seen from FIG. 1 that the etch rate of a silicon nitride film decreases as the concentration of phosphoric acid increases, when the concentration of phosphoric acid is 60% by weight or greater. Accordingly, the etch rate of a silicon nitride film is high only when an appropriate amount of water exists within an etchant. Also, a solution containing phosphoric acid of 85% by weight, which is used as a nitride film etchant in the prior art, has a lower etch rate than the etch rate of a solution containing phosphoric acid of 50–70% by weight, under a temperature condition of 120° C.

It can be seen that the etch rate of the silicon nitride film is higher when the concentration of phosphoric acid is about 55–70% by weight than under other phosphoric acid concentration conditions. In particular, it can be seen that, when the concentration of phosphoric acid is about 60% by weight, the etch rate of the silicon nitride film achieves maximum, that is, about 12 Å/min.

Referring to FIGS. 2 and 3, where the temperature of an etchant is 100° C. and 98° C., respectively, the etch rate of the silicon nitride film is higher when the concentration of phosphoric acid is about 50–60% by weight than other phosphoric acid concentration conditions. In particular, when the concentration of phosphoric acid is about 55% by weight, the etch rate per minute of the silicon nitride film is maximized.

As can be seen from FIGS. 1 through 3, the etch rate per minute of a silicon nitride film is desirable when the concentration of phosphoric acid is about 50–70% by weight, when the temperature condition and other conditions (for example, the concentration of other additives such as HF) are kept uniform.

Also, when other conditions except for the temperature condition are the same between FIGS. 1 and 3, for example, when there are no additives such as HF in both of FIGS. 1 and 3, and the concentration of phosphoric acid is the same in FIGS. 1 and 3, the etch rate of a nitride film increases as the temperature of an etchant increases.

Referring to FIG. 4, the etched thickness of a silicon nitride film is greater when the concentration of phosphoric acid in an etchant (which contains hydrofluoric acid of 0.02% by weight) is about 50 to 60% by weight, than other phosphoric acid concentration conditions. This indirectly indicates that the etch rate of a silicon nitride film is higher when the concentration of phosphoric acid is 50–60% by weight than other phosphoric acid concentration conditions.

Experiments 1 through 4 illustrate the following results.

First, when other conditions except for the phosphoric acid concentration condition (for example, the temperature condition, the concentration condition of other additives such as HF, etc.) are kept uniform, the etch rate of a nitride film is higher when the concentration of phosphoric acid is about 50–70% by weight than other phosphoric acid conditions.

Second, in a case where the temperature of a phosphoric acid water solution is about 120° C. (hereinafter, about 120° C. is referred to as 120±5° C.), the etch rate of the nitride film is desirable when the concentration of phosphoric acid is about 55–65% by weight. In a case where the temperature of an etchant is about 100° C. (hereinafter, about 100° C. is referred to as 100±5° C.), the etch rate of the nitride film is desirable when the concentration of phosphoric acid is about 50–60% by weight.

Third, in a case where conditions other than the temperature condition are the same, the etch rate of a nitride film increases as the temperature increases.

(2) Variation in the Etch Rates Per Minute of a Silicon Nitride Film, a Silicon Oxide Film and a Polysilicon Film, and the Etch Selectivity Between the Silicon Nitride Film and the Silicon Oxide Film with Respect to Variations in the Concentration of Hydrofluoric Acid (HF)

[Experiment 5]

Figure 5:
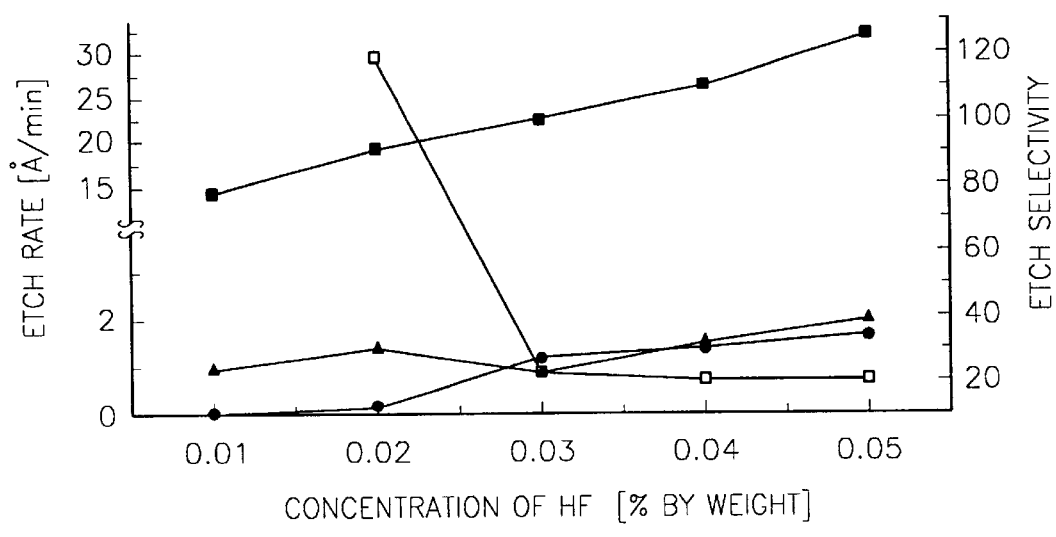
FIG. 5 is a graph showing the etch rates of a silicon nitride film, a silicon oxide film and a polysilicon film and the etch selectivity between the silicon nitride film and the silicon oxide film with respect to variations in the concentration of hydrofluoric acid, when the temperature of an etchant is 120° C. and the concentration of phosphoric acid is 60% by weight.

A phosphoric acid water solution was prepared as an etchant, and a silicon nitride film, a silicon oxide film and a polysilicon film formed on a wafer were etched using the phosphoric acid water solution. Here, the temperature of the etchant was maintained at about 120° C., and the concentration of phosphoric acid was maintained at about 60% by weight. The concentration of phosphoric acid, about 60% by weight, is an optimal phosphoric acid concentration condition obtained by Experiment 1. In Experiment 5, the etch rate per minute of a silicon nitride film, the etch rate per minute of a silicon oxide film, the etch rate per minute of a polysilicon film, and the etch selectivity between the silicon nitride film and the silicon oxide film, are measured with respect to variations in the concentration of hydrofluoric acid. The results of the measurement are shown in FIG. 5. In FIG. 5, the etch rate per minute of a silicon nitride film is indicated by ■, the etch rate per minute of a silicon oxide film is indicated by ●, the etch rate per minute of a polysilicon film is indicated by ▲, and the etch selectivity between the silicon nitride film and the silicon oxide film is indicated by □.

[Experiment 6]

Figure 6:
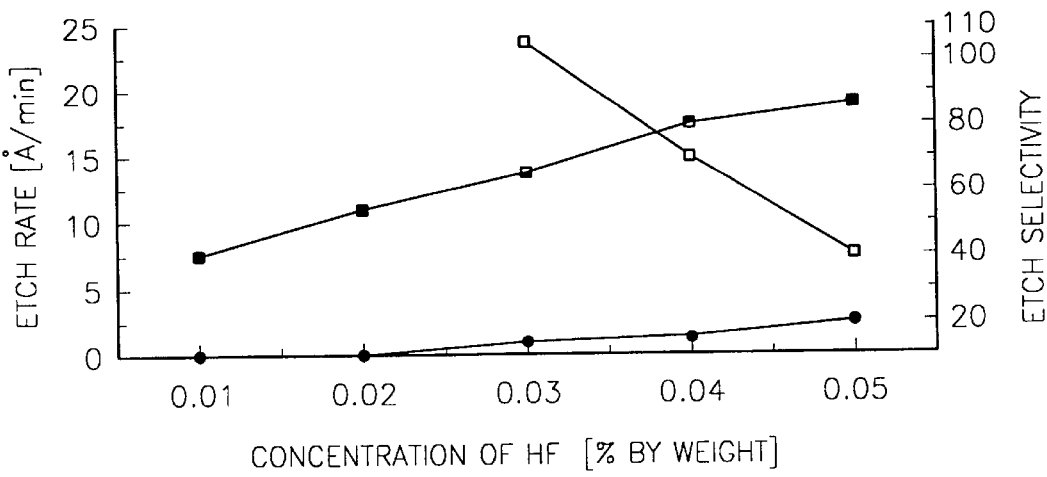
FIG. 6 is a graph showing the etch rates of a silicon nitride film and a silicon oxide film and the etch selectivity between the silicon nitride film and the silicon oxide film with respect to variations in the concentration of hydrofluoric acid, when the temperature of an etchant is 100° C. and the concentration of phosphoric acid is 55% by weight.

A phosphoric acid water solution was prepared as an etchant, and a silicon nitride film and a silicon oxide film were etched using the phosphoric acid water solution. Here, the temperature of the etchant was maintained at about 100° C., and the concentration of phosphoric acid was maintained at about 55% by weight. In Experiment 6, in a state where the concentration of phosphoric acid and the temperature of an etchant are kept constant similar to Experiment 5, the etch rate per minute of a silicon nitride film, the etch rate per minute of a silicon oxide film, and the etch selectivity between the silicon nitride film and the silicon oxide film are measured with respect to a variation in the concentration of hydrofluoric acid. The results of the measurement are shown in FIG. 6. The etch rate per minute of a silicon nitride film, the etch rate per minute of a silicon oxide film, and the etch selectivity between the silicon nitride film and the silicon oxide film in FIG. 6 are indicated by substantially the same characters as those of FIG. 5.

Referring to FIGS. 5 and 6, it can be seen that the etch rate of the silicon nitride film is proportional to the concentration of HF. In FIGS. 5 and 6, the concentration of HF increases to a maximum of 0.05% by weight. However, though not shown in the drawings, at concentrations of HF that are more than 0.05% by weight, the etch rate of the silicon nitride film is also proportional to the concentration of HF.

Comparing FIG. 5 to FIG. 1, in a case where most conditions are the same (here, the temperature of an etchant is about 120° C. and the concentration of phosphoric acid is the same), the etch rate of a nitride film is significantly increased when HF is added, compared to when no HF is added. Also, it can be seen that the etch rate of the nitride film increases as the amount of HF increases.

Comparing FIG. 6 to FIG. 3, in a case where most of conditions are the same (here, the temperature of an etchant is about 100° C. and the concentration of phosphoric acid is the same), the etch rate of a nitride film is significantly increased when HF is added, compared to when no HF is added. Also, it can be seen that the etch rate of the nitride film increases as the amount of HF increases.

Therefore, the experiments on regarding variation in the etch rate of a nitride film according to the concentration of HF illustrate the following:

First, when HF is added, the etch rate of a nitride film increases drastically, compared to when no HF is added.

Second, when conditions other than the HF concentration condition are kept constant (for example, the temperature condition and the concentration condition of other additives such as $H_3PO_4$), the etch rate of a nitride film increases as the concentration of HF increases.

Third, when HF is added, the etch rate of the nitride film is maximum when the concentration of $H_3PO_4$ is about 50–70% by weight, under a condition that the concentration of HF is the same.

(3) Variation in the Etch Selectivity Between a Silicon Nitride Film and a Silicon Oxide Film with Respect to Variations in the Concentration of HF Referring to FIGS. 5 and 6, when the concentration of HF is 0.02% by weight or less in Experiments 5 and 6, a silicon oxide film is hardly etched. From the results of Experiments 5 and 6, it can be seen that the etch selectivity between a silicon nitride film and a silicon oxide film is about 100 or greater when the concentration of HF is 0.02% by weight or less.

In Experiments 5 and 6, when the concentration of HF is 0.05% by weight, the etch rate of the silicon oxide film is about 1–2 Å/min, which is smaller than the etch rate of the silicon nitride film. In this case, the etch selectivity between the silicon oxide film and the silicon nitride film decreases from that when the concentration of HF is 0.02% by weight or less, but still about 20 or greater.

In Experiment 5, it can be seen that the etch rate of a polysilicon film is also less than 2 Å/min when the concentration of HF is 0.05% by weight or less. Though not shown in detail in the graphs, the etch selectivity of the silicon nitride film with respect to the polysilicon film may be similar to the etch selectivity of the silicon nitride film with respect to the silicon oxide film.

Meanwhile, it is apparent from Experiments 5 and 6 that the etch rate of a silicon nitride film decreases when no HF is added to an etchant. Thus, in an etchant according to the present invention containing $H_3PO_4$ and HF, the concentration of HF is, preferably, 0.005% by weight or greater.

Experiments 5 and 6 illustrate the following:

First, when the concentration of HF in an etchant containing $H_3PO_4$ and HF is 0.05% by weight or less, the etch selectivity between the silicon nitride film and the silicon oxide film is about 20 or greater. However, the etch rate of a silicon nitride film decreases when no HF is added to an etchant, so that it is preferable that HF of 0.005% by weight or greater is added to an etchant according to the present invention.

Second, when the concentration of HF in the etchant containing $H_3PO_4$ and HF is 0.02% by weight or less, the etch selectivity between the silicon nitride film and the silicon oxide film is more than 100.

Third, when the concentration of HF in the etchant containing $H_3PO_4$ and HF is 0.05% by weight or less, the etch selectivity between the silicon nitride film and the silicon oxide film is also very high.

(4) Variation in the Etch rate of a Nitride Film with Respect to a Variation in the Concentration of Other Additives

[Experiment 7]

A water solution containing $H_3PO_4$ and HF was prepared as an etchant, and then an additive, for example, $H_2O_2$ or trifluoroacetic acid (TFAA), was added to the etchant. Here, the temperature of the etchant, the concentration of $H_3PO_4$, and the concentration of HF were 120° C., 60% by weight, and 0.04% by weight, respectively. Thereafter, the etch rate per minute of a silicon nitride film was measured while varying the concentration of the additive. Though not shown in detail, the inventor ascertained from Experiment 7 that the etch rate per minute of a silicon nitride film is hardly affected by a variation in the concentration of the additive.

In an etchant of the present invention, in a case where conditions other than the concentration of $H_3PO_4$ (for example, the temperature condition and the concentration condition of an additive such as HF) are kept constant, the etch rate of a nitride film is greater when the concentration of $H_3PO_4$ is about 50–70% by weight than other $H_3PO_4$ concentration conditions. In a case where the temperature of an $H_3PO_4$ water solution is about 120° C., a preferable etch rate of the nitride film is obtained when the concentration of $H_3PO_4$ is about 55–65% by weight. In a case where the temperature of an $H_3PO_4$ water solution is about 100° C., a preferable etch rate of the nitride film is obtained when the concentration of $H_3PO_4$ is about 50–60% by weight. When conditions other than the temperature are the same, the etch rate of a nitride film increases as the temperature increases. When HF is added to an etchant, the etch rate of the nitride film increases, compared to when no HF is added. When conditions other than the concentration of HF in the etchant (for example, the temperature of the etchant and the concentration of an additive such as $H_3PO_4$) are kept constant, the etch rate of the nitride film increases as the concentration of HF increases. When HF is added to the etchant, the etch rate of the nitride film is high when the concentration of $H_3PO_4$ is about 50–70% by weight, under a condition where the concentration of HF is the same. When HF is added to the etchant at a concentration of about 0.05% by weight or less, the etch selectivity between the silicon nitride film and the silicon oxide film is more than 100. However, if no HF is added to the etchant, the etch rate of the silicon nitride film decreases. Thus, the lower limit of the concentration of HF is determined to be 0.005% by weight. In particular, when HF in the etchant is added with a concentration of 0.02% by weight, the etch selectivity between the silicon nitride film and the silicon oxide film is very high, i.e., more than 20. When HF in the etchant is added with a concentration of 0.05% by weight or less, the etch selectivity between the silicon nitride film and the silicon oxide film increases.

In a method of etching a silicon nitride film used in the manufacture of semiconductor devices using an etchant according to the present invention, the silicon nitride film can be etched very fast by adding HF to an $H_3PO_4$ water solution. Also, the silicon nitride film can be rapidly etched even at a temperature of 130° C. or less, which is lower than the temperature used in a conventional etching process.

Furthermore, when the concentration of HF in the etchant is 0.005 to 0.05% by weight, the etch rate of the silicon nitride film can be increased, and the silicon nitride film can be etched at a high etch selectivity with respect to a silicon oxide film or a polysilicon film.

The temperature and concentration of an etchant is accurately controlled by adopting a closed system such as a bathing tube used in the present invention, so that the etching time and an etching state such as an etch rate can be accurately controlled.

Although the invention has been described with reference to a particular embodiment, it will be apparent to one of ordinary skill in the art that modifications to the described embodiment may be made without departing from the spirit and scope of the invention.

What is claimed is:

1. A method of etching a nitride film used in the manufacture of semiconductor devices, comprising supplying an etchant bath with an etchant solution consisting of water, hydrofluoric acid (HF) and phosphoric acid ($H_3PO_4$), maintaining a temperature of the etchant solution of the etchant bath at 130° C. or less, and introducing a wafer into the etchant bath to etch a nitride film on the wafer, wherein the of a concentration of HF in the etchant solution is at most 0.05% by weight, and wherein the concentration of $H_3PO_4$ in the etchant solution is 50–70% by weight.

2. The method of claim 1, further comprising maintaining a temperature of the etchant solution at about 120° C. (±5° C.), and the concentration of $H_3PO_4$ at about 55–65% by weight.

3. The method of claim 1, further comprising maintaining a temperature of the etchant solution at about 100° C. (±5° C.), and the concentration of $H_3PO_4$ at about 50–60% by weight.

4. The method of claim 1, wherein the concentration of HF in the etchant solution is 0.005–0.05% by weight.

* * * * *